(12) United States Patent
Kim et al.

(10) Patent No.: US 9,666,274 B2
(45) Date of Patent: May 30, 2017

(54) SYSTEM AND METHOD FOR MRAM HAVING CONTROLLED AVERAGABLE AND ISOLATABLE VOLTAGE REFERENCE

(71) Applicant: QUALCOMM Incorporated, San Diego, CA (US)

(72) Inventors: Jung Pill Kim, San Diego, CA (US); Taehyun Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/244,456

(22) Filed: Aug. 23, 2016

(65) Prior Publication Data

US 2016/0358649 A1    Dec. 8, 2016

Related U.S. Application Data

(62) Division of application No. 14/161,850, filed on Jan. 23, 2014, now Pat. No. 9,455,031, which is a division
(Continued)

(51) Int. Cl.
*G11C 11/00*     (2006.01)
*G11C 13/00*     (2006.01)
(Continued)

(52) U.S. Cl.
CPC ........... *G11C 13/004* (2013.01); *G11C 5/063* (2013.01); *G11C 7/08* (2013.01); *G11C 13/0038* (2013.01);
(Continued)

(58) Field of Classification Search
CPC .................................................. G11C 11/00
(Continued)

(56) References Cited

U.S. PATENT DOCUMENTS 6,317,376 B1    11/2001    Tran et al.
6,434,044 B1     8/2002    Gongwer
(Continued)

FOREIGN PATENT DOCUMENTS

CN    1813232 A    8/2006
JP    2000232983 A    8/2000
(Continued)

OTHER PUBLICATIONS

International Search Report and Written Opinion—PCT/US2012/061359—ISA/EPO—Jan. 18, 2013.

*Primary Examiner* — Harry W Byrne
(74) *Attorney, Agent, or Firm* — Kenneth K. Vu; Joseph Agusta

(57) ABSTRACT

A memory has a plurality of non-volatile resistive (NVR) memory arrays, each with an associated reference voltage generating circuit coupled by a reference circuit coupling link to a reference line, the reference coupled to a sense amplifier for that NVR memory array. Reference line coupling links couple the reference lines of different NVR memory arrays. Optionally, different ones of the reference coupling links are removed or opened, obtaining respective different average and isolated reference voltages on the different reference lines. Optionally, different ones of the reference circuit coupling links are removed or opened, obtaining respective different averaged voltages on the reference lines, and uncoupling and isolating different reference circuits.

3 Claims, 9 Drawing Sheets

Related U.S. Application Data of application No. 13/278,217, filed on Oct. 21, 2011, now Pat. No. 8,675,390.

(51) Int. Cl.
  *G11C 5/06* (2006.01)
  *G11C 7/08* (2006.01)
  *G11C 29/02* (2006.01)

(52) U.S. Cl.
  CPC ........ *G11C 13/0069* (2013.01); *G11C 29/026* (2013.01); *G11C 29/028* (2013.01); *G11C 2013/0054* (2013.01)

(58) Field of Classification Search
  USPC ......... 365/48, 66, 78, 80–93, 100, 130, 131, 365/148, 158, 163, 171, 173, 225.5, 365/243.5; 257/2–5, 296, E31.047, 257/E21.665; 438/29, 95, 96, 166, 259, 438/365, 482, 486, 597
  See application file for complete search history.

(56) References Cited

U.S. PATENT DOCUMENTS

| | | | |
|---|---|---|---|
| 6,801,448 B2 | 10/2004 | Hsu | |
| 7,020,023 B2 | 3/2006 | Kuramori | |
| 7,057,922 B2 | 6/2006 | Fukumoto | |
| 7,072,236 B2 | 7/2006 | Matsuoka | |
| 7,227,775 B2* | 6/2007 | Rinerson | G11C 11/16 365/148 |
| 7,382,644 B2* | 6/2008 | Rinerson | G11C 13/0007 365/148 |
| 7,382,645 B2* | 6/2008 | Rinerson | G11C 11/16 365/148 |
| 8,134,866 B2* | 3/2012 | Bae | G11C 5/143 365/163 |
| 8,139,432 B2 | 3/2012 | Choi et al. | |
| 8,395,925 B2 | 3/2013 | Kawai et al. | |
| 8,675,390 B2 | 3/2014 | Kim et al. | |
| 8,724,414 B2 | 5/2014 | Kim et al. | |
| 2004/0004856 A1 | 1/2004 | Sakimura et al. | |
| 2005/0024967 A1 | 2/2005 | Matsuoka | |
| 2005/0083764 A1 | 4/2005 | Kuramori | |
| 2005/0122768 A1 | 6/2005 | Fukumoto | |
| 2006/0092690 A1 | 5/2006 | Kim et al. | |
| 2006/0209585 A1 | 9/2006 | Tanizaki et al. | |
| 2006/0245241 A1* | 11/2006 | Rinerson | G11C 11/16 365/158 |
| 2007/0140029 A1 | 6/2007 | Kim et al. | |
| 2008/0002461 A1* | 1/2008 | Rinerson | G11C 11/16 365/158 |
| 2008/0002483 A1* | 1/2008 | Rinerson | G11C 13/0007 365/189.09 |
| 2008/0285360 A1 | 11/2008 | Sakimura et al. | |
| 2008/0316798 A1 | 12/2008 | Tanizaki et al. | |
| 2009/0122592 A1 | 5/2009 | Tokiwa | |
| 2009/0135642 A1 | 5/2009 | Kim et al. | |
| 2010/0046286 A1 | 2/2010 | Choi | |
| 2010/0073992 A1 | 3/2010 | Ueda | |
| 2010/0103726 A1* | 4/2010 | Bae | G11C 5/143 365/163 |
| 2010/0195415 A1 | 8/2010 | Seko | |
| 2011/0026303 A1 | 2/2011 | Choi et al. | |
| 2011/0051492 A1 | 3/2011 | Toda | |
| 2012/0069629 A1 | 3/2012 | Ueda et al. | |
| 2013/0070538 A1 | 3/2013 | Sugamoto | |
| 2014/0133216 A1 | 5/2014 | Kim et al. | |

FOREIGN PATENT DOCUMENTS

| | | |
|---|---|---|
| JP | 2001177065 A | 6/2001 |
| JP | 2002032983 A | 1/2002 |
| JP | 2004110881 A | 4/2004 |
| JP | 2004531801 A | 10/2004 |
| JP | 2004348937 A | 12/2004 |
| JP | 2005122801 A | 5/2005 |
| JP | 2013069355 A | 4/2013 |
| WO | 2011100244 A1 | 8/2011 |
| WO | 2012033884 A1 | 3/2012 |

* cited by examiner

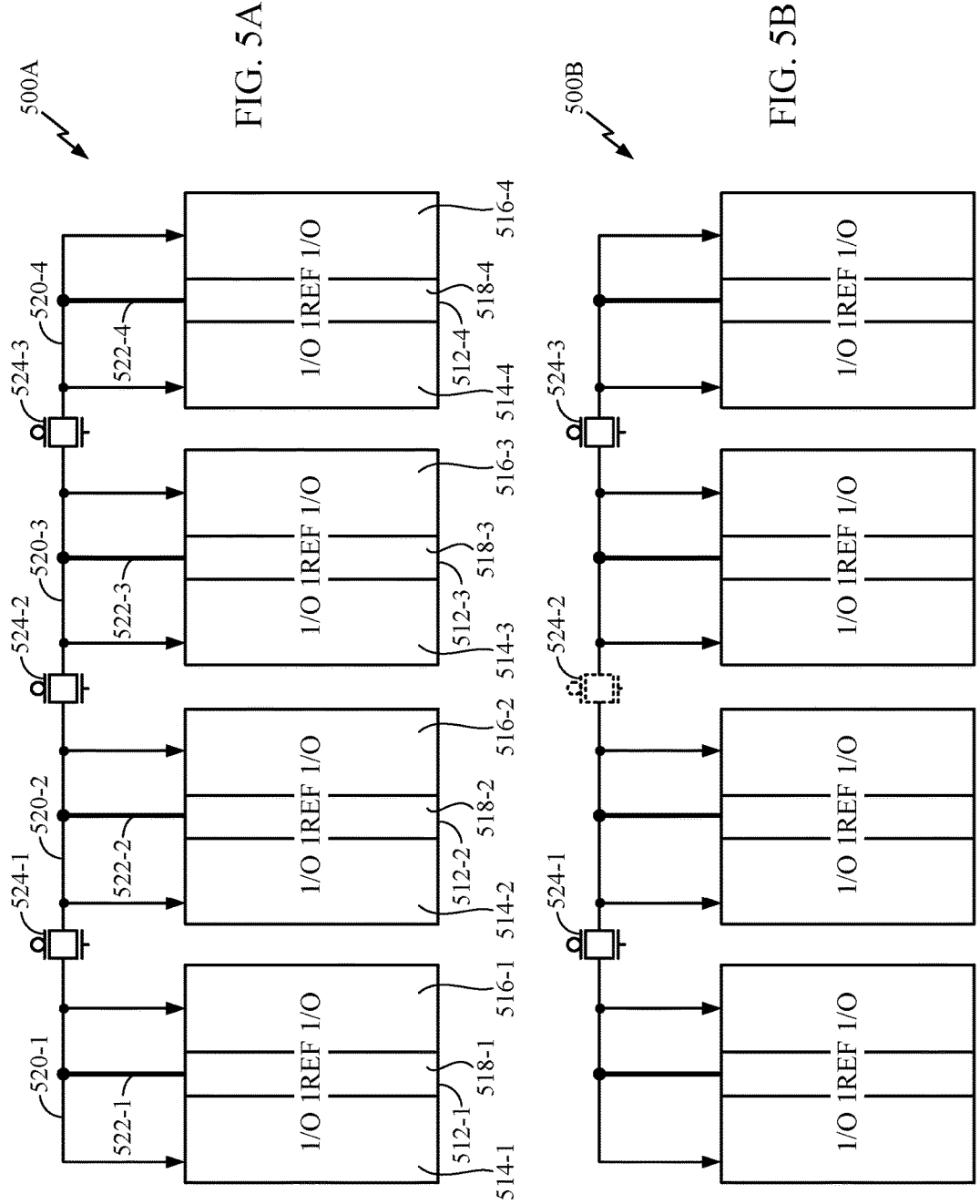

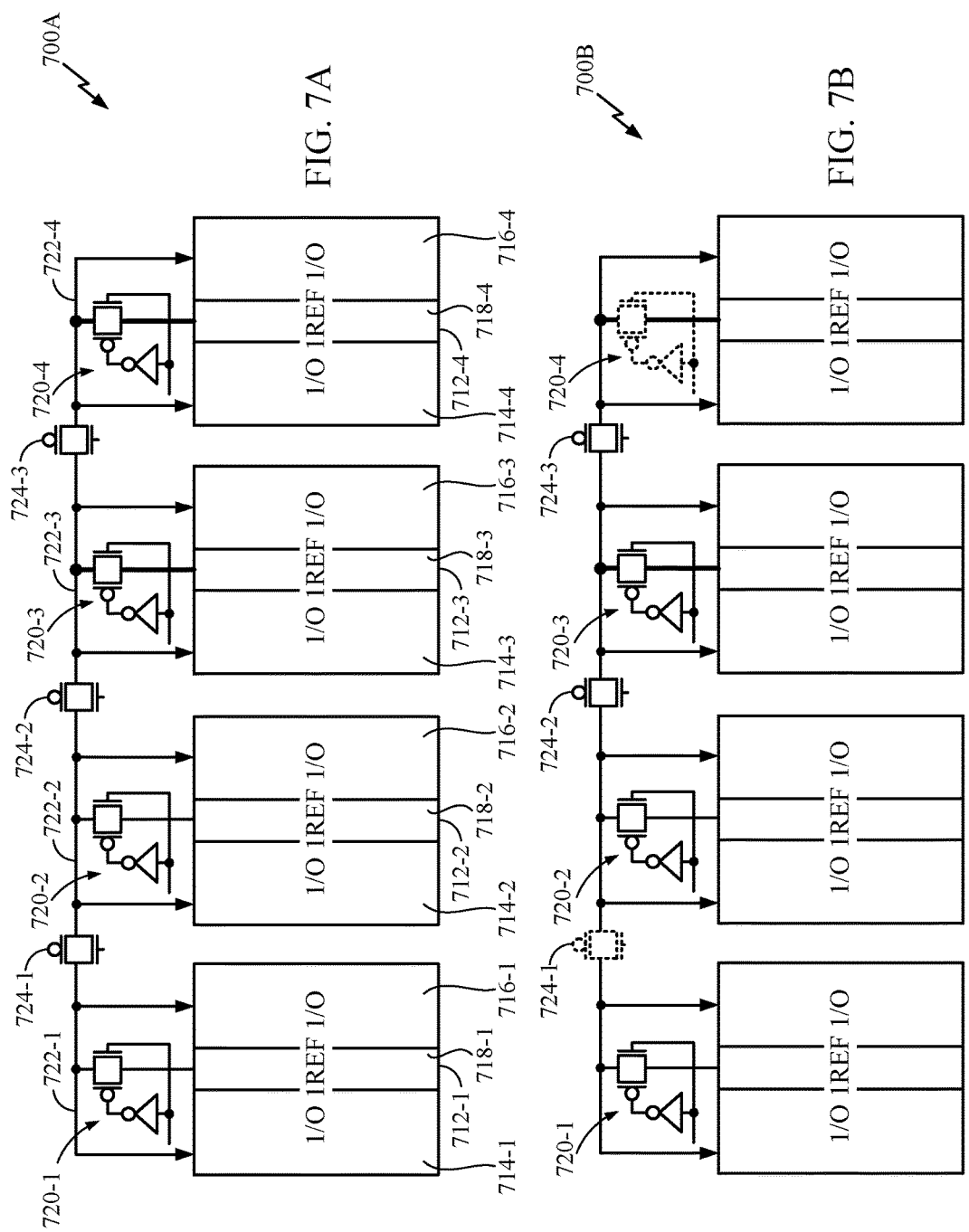

SYSTEM AND METHOD FOR MRAM HAVING CONTROLLED AVERAGABLE AND ISOLATABLE VOLTAGE REFERENCE

The present application for patent is a divisional of, and claims priority to Non-Provisional application Ser. No. 14/161,850, entitled "SYSTEM AND METHOD FOR MRAM HAVING CONTROLLED AVERAGABLE AND ISOLATABLE VOLTAGE REFERENCE", filed Jan. 23, 2014, which is a divisional of, and claims priority to Non-Provisional application Ser. No. 13/278,217, entitled "SYSTEM AND METHOD FOR MRAM HAVING CONTROLLED AVERAGABLE AND ISOLATABLE VOLTAGE REFERENCE", filed Oct. 21, 2011, both being assigned to the assignee hereof and both are hereby expressly incorporated by reference herein in their entirety.

FIELD OF DISCLOSURE

The present application relates to non-volatile resistive memories and, more particularly, to generation and distribution of reference voltages for accessing non-volatile resistance memories.

BACKGROUND

Personal computing devices such as portable wireless telephones and personal digital assistants (PDAs) are requiring ever-increasing data storage capacity to perform a continuously longer list of applications. For example, a wireless telephone can include a digital video camera, video and audio file player, portable game player, and Internet access/web browser. Concurrently though, portable communication devices are becoming ever smaller and, since the processing for such tasks can consume considerable power, and battery life is highly valued, power consumption by the data storage is preferably kept to a minimum.

Resistance-memories, which store data as a switchable resistance, show promise in meeting currently anticipated data storage needs of personal computing devices, as they may provide high capacity, show increasing access speeds, and have low power consumption.

One kind of resistance memory device is the magnetic random access memory (MRAM). MRAMs typically consist of a row-column array of magnetic tunneling junction (MTJ) transistors. Data is stored in the MTJ by selective current flow to induce a magnetic field, switching the MTJ's magnetization between two states. The resistance of the MTJ corresponds to its magnetic state and is readable. Reading may be performed by injecting a data read current through the storage MTJ to cause a read voltage and, concurrently, injecting a reference read current of approximately the same value through reference MTJs having a pre-set reference resistance state. The pre-set reference resistance states are selected such that the reference voltage is halfway between the storage MTJ's read voltage at its high resistance state and low resistance state. Therefore, comparing the read voltage against the reference voltage indicates, preferably with acceptable accuracy, the storage MTJ's resistance state.

SUMMARY

Exemplary embodiments are directed to systems and methods for generating and coupling reference voltages in resistive memory devices.

In one or more exemplary embodiments, a non-volatile resistive (NVR) memory is provided that may have a plurality of reference cells associated with at least one array of bitcells (I/O) and, further, at least two of the plurality of reference cells may be coupled to a common node. Further to this aspect, a plurality of sense amplifiers may be associated with the I/Os, where at least one sense amplifier is coupled to the common node.

In a further aspect at least one switching device may be configured to isolate at least one of the plurality of reference cells.

In another aspect at least one switching device may be configured to isolate at least one of the plurality of reference cells from the common node.

In other exemplary embodiments, an NVR memory is provided that may have a first array of bitcells (I/O) having a first reference cell, a first reference cell selectable link from the first reference cell to a first I/O reference line, and a first sense amplifier coupled to the first I/O reference line, and may further have a second I/O having a second reference cell, a second reference cell selectable link from the second reference cell to a second I/O reference line, and a second sense amplifier coupled to the second I/O reference line. Further, a reference line coupling link may be provided between the first I/O reference line and the second I/O reference line.

In one aspect at least one of the first reference cell selectable link and the second reference cell selectable link may be a fusible link capable of being blown to isolate at least one of the first reference cell from the first I/O reference line and the second reference cell from the second I/O reference line.

According to one or more exemplary embodiments, a method for Non-Volatile Resistive memory is provided, and example methods may include providing at least one I/O, each I/O having at least one reference cell having a reference voltage output node and a corresponding I/O reference line, and may further include selecting at least two of the I/O reference lines for a common reference line, and coupling at least two of the selected I/O reference lines to form a common reference line.

In one aspect, in methods according to these exemplary embodiments, the selecting of the at least two I/O reference lines may include comparing a voltage at the respective reference voltage output node of at least two of the I/Os to a given acceptable range and, further, the selecting at least one of the I/O reference lines may be based, at least in part, on a result of the comparing.

In another aspect, methods according to these exemplary embodiments may also include identifying an acceptability of a voltage at the reference voltage output of the reference cell of at least one of the I/Os, relative to a given range of acceptability, and isolating at least one of the reference cells based on a result of the identifying an acceptability.

According to one or more exemplary embodiments, an NVR memory may be provided that may include means for generating a first reference voltage, and means for generating a second reference voltage. NVR memory according to these embodiments may have means for providing a first sensing reference and a second sensing reference, and this means may include means for selectively combining the first reference voltage and the second reference voltage into a common voltage and for selectively providing the common voltage as the first sensing reference, and means for selectively providing the first reference voltage as the first sensing reference. NVR memory according to these embodiments may also have means for sensing a voltage of a first array of bitcells relative to the first sensing reference, and means for sensing a voltage of a second array of bitcells relative to the second sensing reference.

BRIEF DESCRIPTION OF THE DRAWINGS

The accompanying drawings are presented to aid in the description of embodiments of the invention and are provided solely for illustration of the embodiments and not limitation thereof.

FIGS. 5A and 5B are a simplified schematic of a first and second state, respectively, of one example multiple bank resistance memory, showing switch-coupled aspects of controllable, selective coupled reference nodes in accordance with one or more exemplary embodiments.

FIGS. 7A and 7B are a simplified schematic of a first and second state, respectively, of one example multiple bank resistance memory, showing switch-coupled aspects of controllable, selective coupled/isolatable reference nodes and reference circuits in accordance with one or more exemplary embodiments.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequences of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Figure 1:
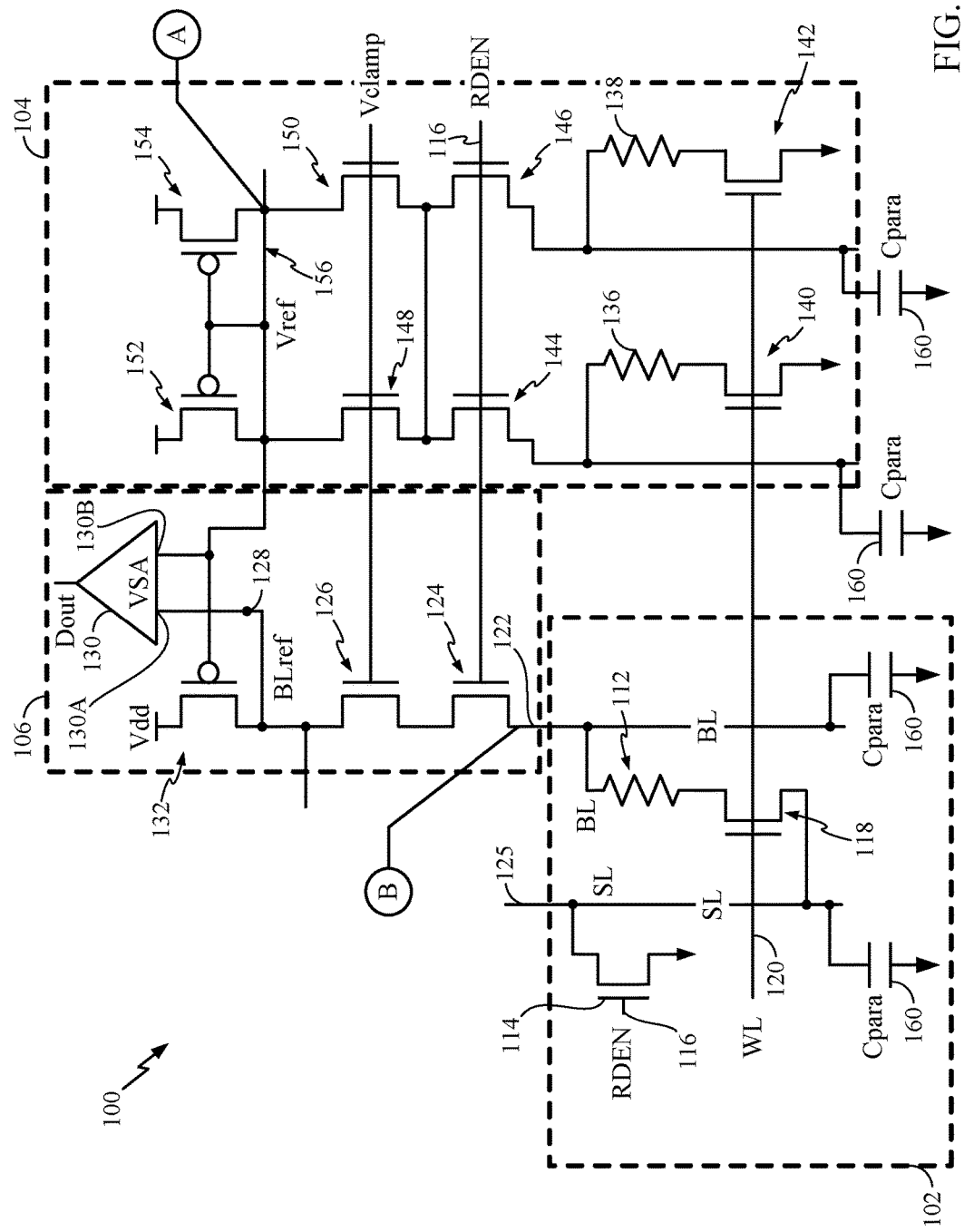
FIG. 1 is a simplified schematic diagram of one example resistance memory storage cell, and associated reference and read circuitry.

FIG. 1 is a simplified schematic of one non-volatile resistive memory ("NVR") circuit 100 comprising one NVR bit cell 102, an associated NVR reference circuit or cell 104, and a sense amplifier (SA) circuit 106. It will be understood that, for purposes of this description, the terms "reference cell 104" and "reference circuit 104" have mutually identical meaning, and will be used interchangeably. The NVR bit cell 102 may be representative of, for example, one NVR bit cell in an array of M columns by N rows (not shown in FIG. 1). The NVR reference cell 104 may be associated with, for example, M−1 other NVR bit cells in the row in which the depicted NVR bit cell 102 is located. Further, each of N rows of an M by N array of NVR bit cells such as 102 may have an associated NVR reference cell such as 104. The sense amplifier circuit 106 provides read results by comparing a read voltage from the NVR bit cell 102 with a reference voltage from the NVR reference cell, as is described in greater detail at later sections.

Referring still to FIG. 1, the NVR bit cell 102 comprises a resistive memory element 112 that may be switched into two or more different magnetization states, each having a distinct resistance. The resistive memory element may, for example, be a magnetic tunneling junction (MTJ) element. The NVR bit cell 102 may have a column read enabled transistor 114 controlled by a column read select (RDEN) line 116, and may have a word line enabled transistor 118 controlled by a word line (WL) 120. It may be assumed that an M by N array of NVR bit cells 102 has M separate column read select lines, one for each column, and N separate word lines 120, one for each row. One end of the resistive memory element 112 couples to the bit line 122. Therefore, when the column read enabled transistor 114 is switched on the resistive memory element 112 provides a current path from the bit line 122 to the source line (SL) 125 to ground. It may be assumed that an M by N array of NVR bit cells 102 may have a bit line such as 122 extending through each column, with one end of a resistive memory element such as 112 in each of the N NVR bit cells in the column coupled to that bit line 122. Since only one of the NVR bit cells in a column may be enabled at once, the resistive memory element of the enabled NVR bit cell is the path from the bit line 122 to ground.

Continuing to refer to FIG. 1, the column select transistor 124, controlled by the RDEN signal on the column read select line 116, in series with the Vclamp transistor 126 controls coupling of the bit line 122 to the bit line reference node 128. With respect to control of the Vclamp transistor 126, it may be assumed to be always on in normal read operations. As will be understood by persons of ordinary skill in the art, the Vclamp level is determined by the maximum allowed current through 122 to ground. The bit line reference node 128, in turn, is coupled to input 130A of the voltage sense amplifier 130 in the sense amplifier circuit 106. The voltage Vref at node or shunt 156 of the NVR reference cell 104 is coupled to input 130B of the voltage sense amplifier 130, and to the gate (not separately numbered) of the read current transistor 132. When the NVR bit cell 102 is enabled the read current transistor 132, controlled by Vref, provides a read current to a read current path from the input 130A of the sense amplifier 130 to ground, through the resistive memory element 112, as will be described in greater detail at later sections.

Referring still to FIG. 1, the NVR reference cell 104 may be structured similar to the NVR bit cell 102 but has at least two reference resistive memory elements 136 and 138, instead of the one resistive memory element 112 of the NVR bit cell 102. The word enabled transistors 140 and 142 each perform substantially the same function—in relation to the reference resistive memory elements 136 and 138, respectively—that the word enabled transistor 118 performs in relation to the resistive memory element 112 of the NVR bit cell 102. Similarly, the column select transistors 144 and 146 each perform substantially the same function, relative to the reference resistive memory elements 136 and 138, as performed by the column select transistor 124 in relation to the resistive memory element 112. It may be assumed that the Vclamp transistors 148 and 150, in normal read operations, are each in an on state. The first reference current transistor 152 and the second reference current transistor 154 have their respective gates coupled to the same Vref shunt or node 156, and the Vref node 156 also couples to the input 130B of the voltage sense amplifier 130. It is generally preferred that the read current transistor 132, the first reference current transistor 152 and the second reference current transistor 154 have substantially the same width and, accordingly, the same current characteristics.

With continuing reference to FIG. 1, parasitic capacitances 160 are simplified models of general examples of parasitic capacitances that may manifest in actual NVR memories such as depicted at FIG. 1. Persons of ordinary skill in the NVR memory art, having view of this disclosure, can readily model and analyze parasitic capacitances and their various effects, if any, relating to practices according to the present embodiments and, therefore, further detailed description is omitted.

To avoid unnecessary complexity in the figures and unnecessary accompanying description, FIG. 1 omits explicit depiction of the write circuitry for setting the magnetization state of the resistive memory element 112 and the reference resistive memory elements 136 and 138. As known to persons of ordinary skill in the NVR memory art, data is written to an NVR bit cell such as 102 by injecting current according to various parameters, established in part by the particular structure and technology of the resistance memory elements. Such persons, having view of the present disclosure, can readily implement means for writing to, i.e., setting magnetization states of resistive memory elements such as 112, and reference resistive memory elements such as 136 and 138, to practice according to the present embodiments and, therefore, further detailed description is omitted.

Referring to FIG. 1, one example read process will be described. In the example it will be assumed that resistive memory element 112 is switchable to magnetic states representing a logical "0" and a logical "1," one having a low resistance state, Rlow, and the other having a high resistance state Rhigh. It will also be assumed that the first reference resistance memory element 136 has been set at the magnetization state exhibiting Rlow, and the second reference resistance memory element 138 has been set at the magnetization state exhibiting Rhigh.

The example read process may begin by putting an enabling voltage on the FIG. 1 depicted word line 120 and on the depicted column read select line 116. Methods and structures for controlling word lines and bit select lines in a resistive memory array are well known and, therefore, further detailed description is omitted. The column read select line 116 voltage switches the column read enabled transistor 114 to an on state, and switches the column select transistors 124, 144, and 146 to an on state. The word line 120 voltage switches word line enabled transistors 118, 140 and 142. A read current path is therefore established, from Vdd through the read current transistor 132, through the Vclamp transistor 126, through the column select transistor 124, to the bit line 122, through the resistive memory element 112, through the source line 125, through the word line enabled transistor 118, and then through the column read enabled transistor 114 to ground.

Referring still to FIG. 1, setting the enabling voltage on the word line 120 and the column read select line 116 also establishes a reference current path from Vdd to ground that includes the first and the second reference resistive memory elements 136 and 138. More specifically, the enable voltage on the column read select line 116 switches the column read enabled transistor 114, and the column select transistors 124, 144 and 146. Likewise, the enable voltage on the word line 120 switches the word line enabled transistors 118, 140 and 142. The result is two parallel reference current paths from Vdd to ground, shunted together by the Vref shunt or node 156. It will be understood that, for purposes of this description, the terms "Vref shunt 156" and "Vref node 156" have mutually identical meaning, and will be used interchangeably. One of the reference current paths is through the reference current transistor 152, to the Vref node 156, through the Vclamp transistor 148, through the column select transistor 144, through the first reference resistance memory element 136, then through the first word line enabled transistor 140 to ground. The second of the two of reference current paths is through the second reference current transistor 154, to the same Vref node 156, through the Vclamp transistor 150, through the column select transistor 146, through the second reference resistance memory element 138, then through the second word line enabled transistor 142 to ground.

As previously described, it is generally preferable that the resistance memory element 112, the first reference resistance memory element 136, and the second reference resistance memory element 138 have substantially identical magnetization-resistance characteristics, in particular the same Rhigh and Rlow values. Likewise, it is generally preferred that the read current transistor 132 of the NVR bit cell, the first reference current transistor 152, and the second reference current transistor 154 have substantially the same width and, therefore, substantially the same current characteristics. Further, as described, the first reference resistance memory element 136 is assumed to be set at the Rlow state, representing a logical "0," and the second reference memory element 138 set at the Rhigh state, representing a logical "1." When the read current path is established, the resistance of the read current transistor 132 from Vdd to the bit line reference node 128 in series with the resistance from the bit line reference node 128 to ground may, as one approximation, be viewed as a voltage divider relative to Vdd. Since the latter resistance has one of two values, depending on whether the resistance memory element 112 is at the Rhigh or Rlow state, the voltage at the bit line reference node 128 resulting from the read current through the read current path, which is one of Vhigh and Vlow, indicates that resistance state. The Vref at node 156 is therefore, ideally, at the midpoint between Vhigh and Vlow. The output of the voltage sense amplifier 130 is therefore indicative of the value stored in the NVR bit cell 102.

As will be readily understood by persons of ordinary skill in the art, variations in the actual value of the voltage appearing on the Vref node 156 will move the decision threshold by the voltage sense amplifier closer to one of Vhigh or Vlow than to the other. Therefore, assuming a logical "0" and logical "1" have equal likelihood of being the value stored by the resistance memory element 112, moving the voltage at the Vref node 156 either up or down relative to the ideal midpoint will increase the overall bit error rate.

Figure 2:
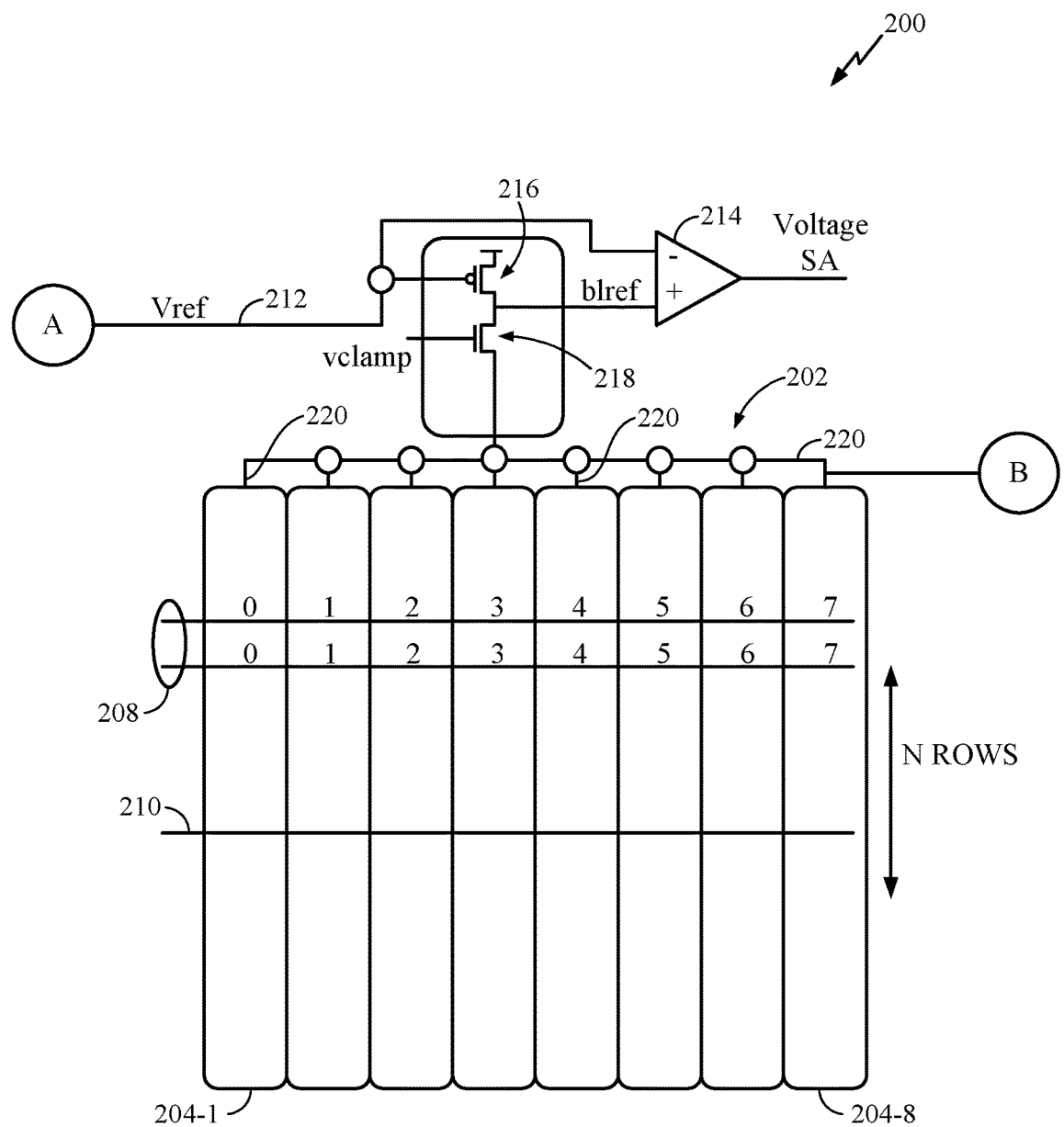
FIG. 2 is a simplified functional diagram of one example resistance memory cell array and an associated reference and read circuitry.

FIG. 2 is a simplified schematic of one example NVR storage array 200, having an NVR bit cell array 202 of M=eight (8) columns 204-1 . . . 204-8 (generically 204-$i$), by N rows NVR bit cells (not separately shown). One example is N=512. The values of M=8 and N=512 are only examples, as each may be any number. Each NVR bit cell array 202 may be structured such as the example 102 of FIG. 1. Write circuitry is omitted to avoid unnecessary complexity not relevant to concepts of the embodiments. Accessing an individual NVR bit cell of the NVR array 202, for purposes of reading its stored data, is by selectively powering one of the M column read select lines, shown collectively as 208, concurrent with powering one of the N word lines, such as the one depicted generic example 210-$n$. The NVR bit cell at the intersection of the powered column read select line and word line is enabled. Assuming the NVR bit cell is according to the FIG. 1 example 102, its resistance memory element (e.g., 112) becomes the path from the "+" input of the voltage sense amplifier 214 to ground. A read current then passes through the read current transistor 216 and VClamp transistor 218, through that resistance memory element to ground. A voltage Vref received on the Vref line 212 couples to the "−" terminal of the voltage sense amplifier. The Vref line 212 may, for example, couple to a Vref node (not shown in FIG. 2) of an NVR reference cell, such as the reference node 156 of the FIG. 1 example NVR reference cell 104. The reference label "A" that is common to FIGS. 1 and 2 illustrates such an example. Similarly, any of the FIG. 2 bit lines 220 may be the bit line 122 of an NVR bit cell (not shown in FIG. 2) according to the FIG. 1 example 102, as shown by the reference label "B" that is common to FIGS. 1 and 2, and the bit line reference node 128 of the FIG. 1 example NVR memory circuit 100.

As previously described, inaccuracy of the Vref voltage may have substantial effect on read accuracy, i.e., may result in a substantial unacceptable increase in BER. As will be appreciated by persons of ordinary skill in the art, the smaller the difference between Vhigh and Vlow the greater the negative effect of this Vref voltage inaccuracy.

Figure 3:
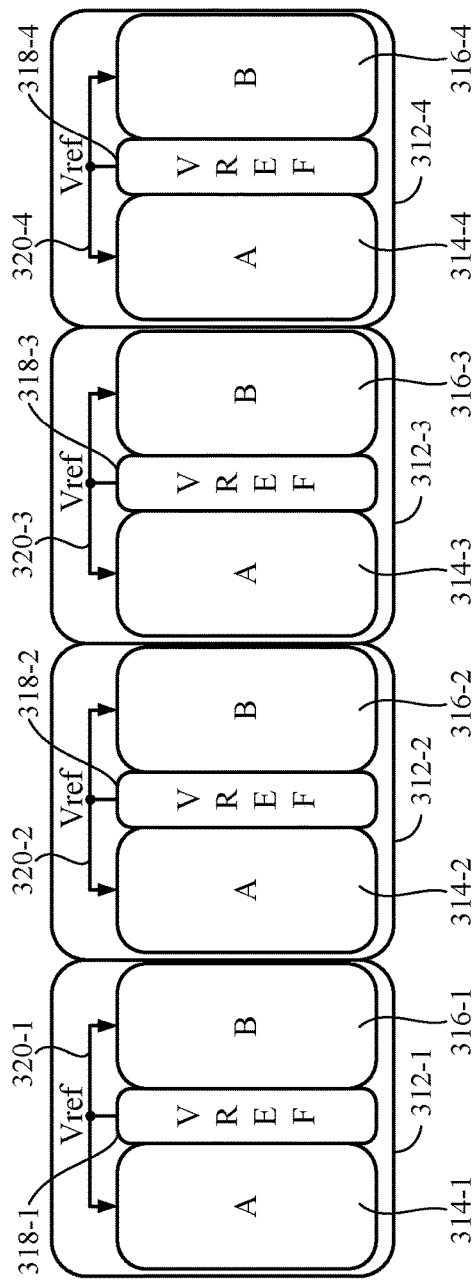
FIG. 3 is a simplified functional diagram of one example multiple bank resistance memory.

The attached Related Art FIG. 3 shows one example NVR system 300, having four (4) NVR memory banks, labeled 312-1, 312-2, 312-3, and 312-4 (generically "312-$k$"). Each NVR memory bank 312-$k$ may comprise arrays of bitcells, for example an NVR array 314-$k$ and 316-$k$, and a Vref circuit 318-$k$ shared by the NVR arrays 314-$k$ and 316-$k$. Each NVR array 314-$k$ and 316-$k$ may be generically referenced as an "I/O." Each Vref circuit 318-$k$ couples to a Vref line 320-$k$ for the corresponding NVR memory bank 312-$k$. Therefore, as readily seen, Vref generation and distribution is individual to each NVR memory bank 312-$k$.

Due to fabrication variations, though, separate Vref circuits 318-$k$ as depicted in the Related Art FIG. 3 may generate respectively different reference voltage levels. In other words, instead of the same value of reference voltage being received at the respective pair of sense amplifiers (not explicitly shown in FIG. 3) of each of NVR memory banks 312-$k$, each pair of sense amplifiers may receive a corresponding one of four different voltages. For example, the Vref circuits 318-1, 318-2, 318-3 and 318-4 may generate, respectively, voltages VRef-1, VRef-2, VRef-3 and VRef-4 (generically VRef-k) not separately labeled on FIG. 3), each being on a respective one of the separate Vref lines 320-1, 320-2, 320-3 and 320-4. Further to the VRef-k being unequal to VRef-1, there is statistical likelihood of at least one of the voltages VRef-1, VRef-2, VRef-3, and VRef-4 being outside of an acceptable deviation. This statistical likelihood may result in reduced fabrication yield.

Figure 4:
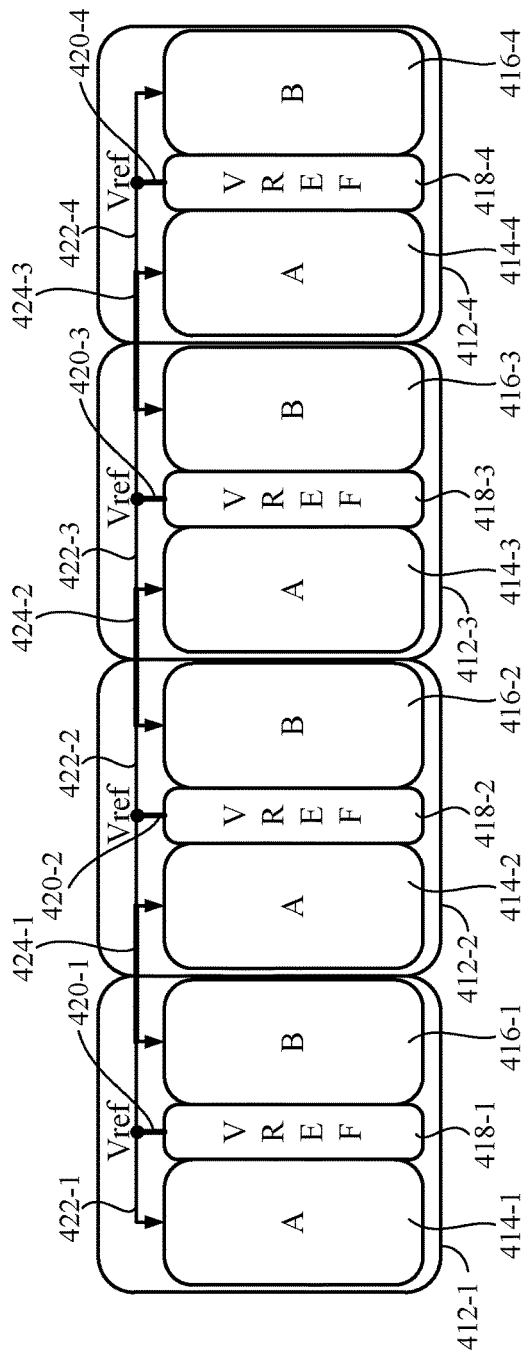
FIG. 4 is a simplified schematic diagram of one example multiple bank resistance memory having one example selective coupled reference in accordance with one or more exemplary embodiments.

FIG. 4 shows one NVR memory system 400 according to one or more exemplary embodiments that provides, among other benefits, a substantially tighter statistical distribution for Vref than may be available using the separate Vref generation for each NVR memory bank.

Referring to FIG. 4, the NVR memory system 400 is shown as having four (4) NVR memory banks, labeled 412-1, 412-2, 412-3, and 412-4 (referenced collectively as "412," and referenced singly in a generic sense as "412-$k$"). It will be understood that four is only one example, and is not intended as any limitation on the scope of any embodiment. Each NVR memory bank 412-$k$ may comprise one or more I/Os, for example the depicted I/O 414-$k$ and I/O 416-$k$, each of which may include an M column by N row array of NVR bit cells (not individually shown in FIG. 4). As one example, I/Os 414-$k$ and 416-$k$ may be configured according to the FIG. 2 example NVR storage array 200. The NVR bit cells of I/Os 414-$k$ and 426-$k$ may be according to the NVR bit cell 102 shown in FIG. 1.

In one aspect, each NVR memory bank 412-$k$ may also comprise a Vref circuit 418-$k$ (referenced collectively as "418"). The Vref circuits 418 may be formed of an array, for example a 1×M array, of reference circuits or cells according to the FIG. 1 example NVR reference cell 104. It will be understood, however, that the various exemplary embodiments are not limited to arrays of only NVR bit cells such as the example NVR bit cell 102, or to NVR reference cells such as the example NVR reference cell 104. Each Vref circuit 418-$k$ couples to a reference circuit coupling link 420-$k$ among the depicted reference circuit coupling links 420-1, 420-2, 420-3 and 420-4 (referenced collectively as "reference circuit coupling links 420.") Each reference circuit coupling link 420-$k$ in turn couples to a reference distribution line 422-*k* for the NVR memory bank 412-*k*, where 422-*k* is among the depicted NVR bank reference distribution lines 422-1, 422-2, 422-3 and 422-4 (among (referenced collectively as "NVR bank reference distribution lines 422"). Each NVR bank reference distribution line 422-*k* couples its voltage to at least the corresponding I/Os 414-*k* and 416-*k*. The coupling may be to one input of each of one or more voltage sense amplifiers (not shown in FIG. 4) within the NVR memory bank 412-*k*. For example, the NVR bank reference distribution line 422-1 may feed one input of a voltage sense amplifier within the I/O 414-1 and one voltage sense amplifier within the I/O 416-1.

With continuing reference to FIG. 4, according to one aspect reference line coupling links, such as the depicted examples 424-1, 424-2 and 424-3, may couple the NVR bank reference distribution lines 422 of any two or more of the depicted four NVR memory banks 412 to one another. This will obtain a common reference voltage line, having an average of the reference voltages generated by the reference circuits 418 coupled to the coupled NVR bank reference distribution lines 422. In the depicted example, the first reference line coupling link 424-1 couples the NVR bank reference distribution line 422-1 of the first NVR memory bank 412-1 to the NVR bank reference distribution line 422-2 of the second NVR memory bank 412-2. Similarly, the second reference line coupling link 424-2 couples the NVR bank reference distribution line 422-2 of the second NVR memory bank 412-2 to the NVR bank reference distribution line 422-3 of the third NVR memory bank 412-3. Further, the third reference line coupling link 424-3 couples the NVR bank reference distribution line 422-3 of the third NVR memory bank 412-3 to the NVR bank reference distribution line 422-4 of the fourth NVR memory bank 412-4.

As can be appreciated, the FIG. 4 NVR memory system 400 according to one exemplary embodiment provides multiple, e.g., four, NVR memory banks 412 with a single, common reference voltage, (CM_VRef). The voltage CM_VRef may be modeled, as a general approximation, as the average of the voltages delivered by the Vref circuits 418-1, 418-2, 418-3 and 418-4 in a stand-alone mode, i.e., ¼×(VRef-1+VRef-2+VRef-3+VRef-4). More generally, for R NVR memory banks 412 the voltage CM_VRef=1/R× ΣVRef-k, for k=1 to R.

Among other benefits provided by an NVR memory system having exemplary embodiments as illustrated at FIG. 4 is a tighter statistical distribution of VRef-k among different NVR memory banks 412. As one illustration, referring to FIG. 3, assume a probability of EB of any one of R NVR memory banks 312 having a Vref circuit 314 which, standing alone, generates an out-of-tolerance Vref. The probability of the FIG. 3 system 300 operating satisfactorily is therefore (1-EB)×R. In contrast, using the same example of R NVR memory banks, a system according to the embodiment shown at FIG. 4 may operate satisfactorily, regardless of one or more of its R memory banks having a Vref circuit 418 generating a VRef that, standing alone, would be out-of-tolerance. Stated more generally, for embodiments according to FIG. 4, even though one or more of VRef-k, for k=1 to R may be out of tolerance, the level of the voltage CM_VRef, which is 1/R×ΣVRef-k, for k=1 to R, may be within tolerance.

It will be understood that in a system as depicted at FIG. 4 the actual number of its R Vref circuits 418 that may be out-of-tolerance, with the system still performing satisfactorily, is application specific, e.g., depends on system performance requirements, the acceptable range of Vref, and the particular circuitry of the Vref circuits 418.

It will be understood that the FIG. 4 depicted configuration of the reference line coupling links 424 is only for purposes of example, and is not a limitation on the kind of structure contemplated by the present embodiments for coupling the NVR bank reference distribution lines 422 of different NVR arrays to one another. For example, referring to FIG. 4, an additional reference line coupling link (not shown) may be arranged to couple the NVR bank reference distribution line 422-1 of NVR memory bank 412-1 directly to the NVR bank reference distribution line 422-3 NVR memory bank 412-3. As another example, the reference line coupling link 424-1 may be removed and another reference line coupling link (not shown) may be arranged to couple the NVR bank reference distribution line 422-1 to any of the NVR bank reference distribution lines 422-3 or 422-4.

In one aspect, the reference line coupling links 424 may be fused links, capable of being blown to selectively couple and isolate the bank reference distribution lines 422 of different NVR memory banks 412 from one another. Further, in one aspect, in an NVR memory system according to the FIG. 4 embodiments, the NVR memory banks 412 may be configured, by appropriate configuration of reference line coupling links 424 (e.g., blowing fusible links), into a plurality of two or more groups, with all NVR memory banks 412 in each group having coupled NVR bank reference distribution lines 422. It will be appreciated that such a selectable grouping of the NVR bank reference distribution lines 422 may obtain satisfactory performance from an NVR memory system using R (e.g., four) NVR memory banks as depicted at FIG. 4 that, otherwise, might not be obtained. This may in turn provide a higher yield in fabricating multiple bank NVR memory systems.

In another aspect, one or more of the reference circuit coupling links 420-*k* may be a fusible link. Further to this aspect, various combinations of any of the reference circuit coupling links 420-*k* may be selectively blown, together with various combinations of fusible links forming the reference line coupling links 424-*k*. As will be readily appreciated, these aspects may provide for selective grouping, averaging, and isolating of various Vref circuits 418-*k*.

It will be understood that the NVR bit cells forming the NVR memory banks 412 may be magnetic random access memory (MRAM) banks having one or more arrays of M by N NVR bit cells, each NVR bit cell having, for example, magnetic tunnel junction (MTJ) transistors or spin-torque-transfer (STT) transistors, and that may be phase-change memory (PRAM).

FIGS. 5A and 5B show states 500A and 500B, respectively, of one example of an NVR memory system according to another embodiment. The term "NVR memory system 500" hereinafter means "the NVR memory system structure shown collectively by FIGS. 5A and 5B, capable of moving between states as described, including example states 500A and 500B."

Referring to FIGS. 5A and 5B together, the NVR memory system 500 may have four (4) NVR memory banks, labeled 512-1, 512-2, 512-3, and 512-4 (referenced collectively as "512," and referenced singly in a generic sense as "512-*k*"). It will be understood that four is only one example, and is not intended as any limitation on the scope of any embodiment. Each NVR memory bank 512-*k* may comprise I/Os, for example I/O 514-*k* and I/O 516-*k*, and each may have M columns by N rows of NVR bit cells (not individually shown in FIG. 5). Each NVR memory bank 512-*k* may have an associated Vref circuit 518-*k* (referenced collectively as "518," and referenced singly in a generic sense as "518-*k*"). It will be understood that each Vref circuit 518-*k* may, if uncoupled from all other the generating circuits 518, generate a stand-alone reference voltage and these voltages will be referred to, for description of example operations as VRef-1, VRef-2, VRef-3 and VRef-4 (not shown on FIGS. 5A and 5B).

With continuing reference to FIGS. 5A and 5B, the NVR memory system 500 may have four NVR bank reference distribution lines, labeled respectively as 520-1, 520-2, 520-3 and 520-4 (referenced collectively as "520," and referenced singly in a generic sense as "520-*k*"). In one aspect, four reference circuit coupling links, labeled respectively as 522-1, 522-2, 522-3 and 522-4 (referenced collectively as "524," and referenced singly in a generic sense as "522-*k*"), are provided, each coupling a Vref circuit 518-*k* to a corresponding NVR bank reference distribution line 520-*k*.

In one aspect, the NVR memory system 500 may have a plurality, e.g., three, reference line coupling switches, such as the examples labeled respectively as 524-1, 524-2 and 524-3 (referenced collectively as "524," and referenced singly in a generic sense as "524-*m*"). Example features of the reference line coupling switches 524 are described below in greater detail. It will be understood that the quantity three of the reference line coupling switches 526 is only an example, corresponding to the example quantity of four NVR memory banks 512.

According to one aspect, the first reference line coupling switch 524-1 may selectively couple the NVR bank reference distribution line 520-1 of the first NVR memory bank 512-1 to the NVR bank reference distribution line 520-2 of the second NVR memory bank 512-2. The second reference line coupling switch 524-2 may selectively couple line NVR bank reference distribution line 520-2 of the second NVR memory bank 512-2 to the NVR bank reference distribution line 520-3 of the third NVR memory bank 512-3. The third reference line coupling switch 524-3 may selectively couple the NVR bank reference distribution line 520-3 of the third NVR memory bank 512-3 to the NVR bank reference distribution line 520-4 of the fourth NVR memory bank 512-4.

Referring to FIG. 5A, in the example state 500A all of the reference line coupling switches 524 are closed, meaning all are in a conducting state. The FIG. 5A state 500A therefore obtains the same reference line coupling as described in reference to FIG. 4 no fusible links blown, namely all of the NVR memory banks 512 having a reference voltage CM_VRef equal to ¼×(VRef-1+VRef-2+VRef-3+VRef-4).

In the FIG. 5B example state 500B, in contrast, the reference line coupling switch 524-2 is open. However, the reference line coupling switch 524-1 continues to couple the bank reference distribution line 520-1 of the first NVR memory bank 512-1 to the bank reference distribution line 520-2 of the second NVR memory bank 512-2, and the reference line coupling switch 524-3 continues to couple the bank reference distribution lines 520-3 and 520-4 of NVR memory banks 512-3 and 512-4, respectively. The resulting reference voltage on the bank reference distribution lines 520-1 and 520-2 is therefore the average of the stand-alone VRef-1 and VRef-2. In a similar manner, the resulting reference voltage on the bank reference distribution lines 520-3 and 520-4 is the average of the stand-alone VRef-3 and VRef-4.

Among features and benefits that embodiments as illustrated at FIGS. 5A and 5B provide are a controllable coupling of the bank reference distribution lines 520-*k* into selectable groups of one or more NVR memory banks 512, each group having its own common reference voltage equal to the average of the stand-alone reference voltage of all the Vref circuits 518 of the group. This may in turn provide benefits such as described in reference to FIG. 4, with additional controllability that may provide a still higher yield in fabricating multiple bank NVR memory systems.

Referring still to FIGS. 5A and 5B, in another aspect each reference circuit coupling link 522-*k* may be a fusible link. Further to this aspect, various combinations of any of the reference circuit coupling links 522-*k* may be selectively blown, together with various combinations of switch states of the reference line coupling switches 524. As will be readily appreciated, these aspects may provide for selective grouping, averaging, and isolating of various Vref circuits 518.

Figure 6A:
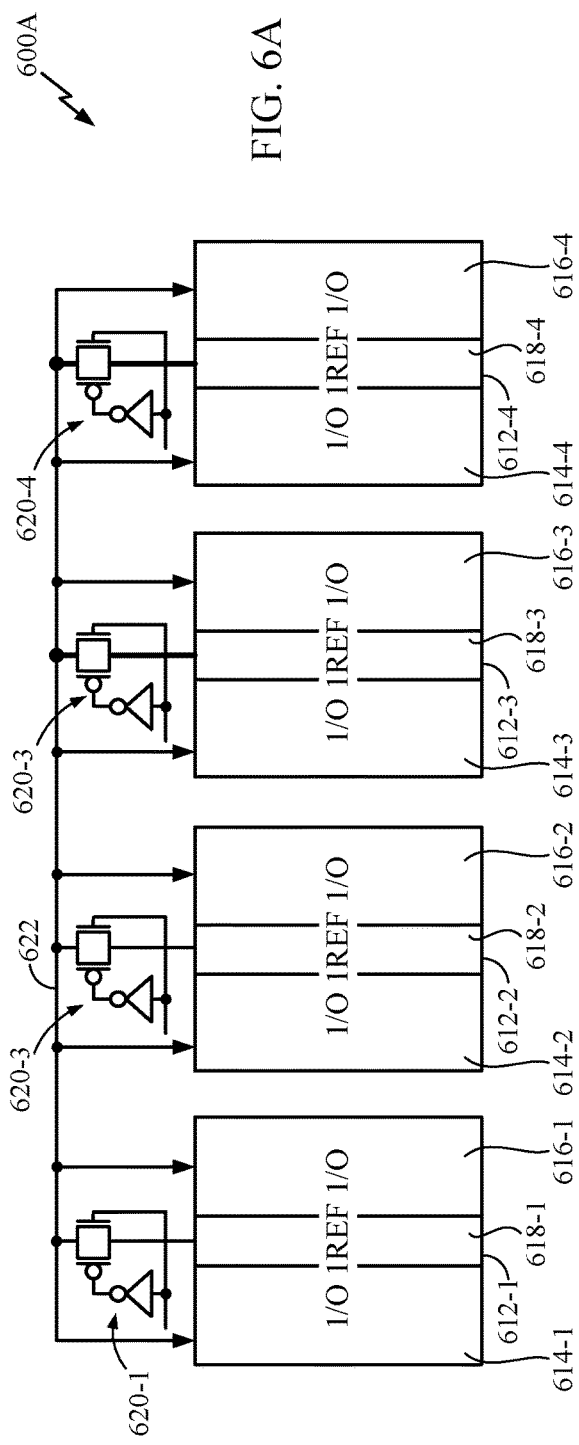
FIGS. 6A and 6B are a simplified schematic of a first and second state, respectively, of one example multiple bank resistance memory showing, switch-coupled aspects of controllable, selective coupled/isolatable reference circuits in accordance with one or more exemplary embodiments.
Figure 6B:
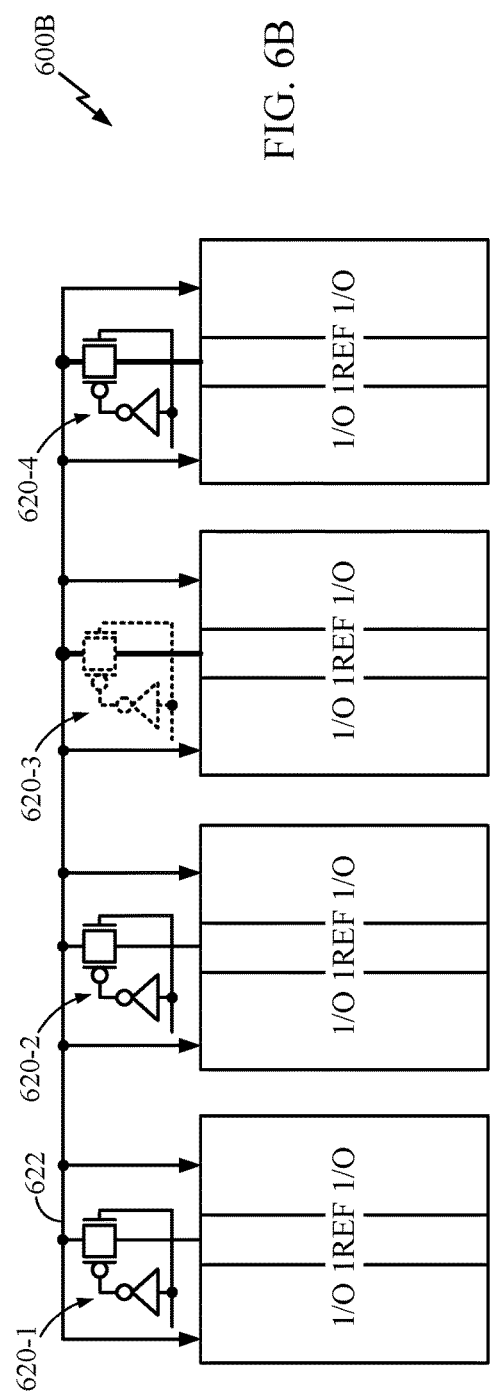

FIGS. 6A and 6B show states 600A and 600B, respectively, of one example of an NVR memory system according to another embodiment. The term "NVR memory system 600" hereinafter means "the NVR memory system structure shown collectively by FIGS. 6A and 6B, capable of moving between states as described, including example states 600A and 600B."

Referring to FIGS. 6A and 6B together, the NVR memory system 600 may have, for example, four (4) NVR memory banks, labeled 612-1, 612-2, 612-3, and 612-4 (referenced collectively as "612," and referenced singly in a generic sense as "612-*k*"). It will be understood that four is only one example, and is not intended as any limitation on the scope of any embodiment. Each NVR memory bank 612-*k* may comprise an I/O 614-*k* and an I/O 616-*k*, each of which may have M columns by N rows of NVR bits cells (not individually shown in FIGS. 6A and 6B). The NVR bit cells forming the NVR memory banks 612 may be according to the NVR bit cell 102 shown in FIG. 1. Each NVR memory bank 612-*k* may have an associated Vref circuit 618-*k* (referenced collectively as "618," and referenced singly in a generic sense as "618-*k*"). The Vref circuits 618 may be formed of an array, for example a 1×M array, of Vref generating cells according to the FIG. 1 example NVR reference cell 104. It will be understood that each Vref circuit 618-*k* may, if uncoupled from all other the generating circuits 618 generate a stand-alone reference voltage and these voltages will be referred to, for description of example operations as VRef-1, VRef-2, VRef-3 and VRef-4 (not shown on FIGS. 6A and 6B).

With continuing reference to FIGS. 6A and 6B, the NVR memory system 600 may, according to one aspect, have four reference circuit coupling switches, labeled respectively as 620-1, 620-2, 620-3 and 620-4 (referenced collectively as "620," and referenced singly in a generic sense as "620-*k*"). Each reference circuit coupling switch 620-*k* selectively couples a corresponding Vref circuit 618-*k* of an NVR memory bank 612-*k* to a common reference line 622, which may extend over all four NVR memory banks 612. In one aspect the common reference line 622 couples to the I/O 616-*k* and 618-*k* of each NVR memory bank 612-*k*. The common reference line 622 may couple to one of the inputs of a respective voltage sense amplifier (not shown in FIGS. 6A and 6B). As will be appreciated, the reference circuit coupling switches 620, provide for selective, incremental control of the CM_VRef by forming selective averaging and, further, provides for feeding this CM-VRef to the I/Os 614-*k* and 616-*k* independent of their local Vref circuit 618-*k*.

Referring to FIG. 6A, in the example state 600A all the reference circuit coupling switches 620 are closed. Each of the four NVR memory banks 612 therefore receives a reference voltage CM_Vref equal to ¼×(VRef-1+VRef-2+VRef-3+VRef-4).

Referring now to FIG. 6B, in the depicted example state 600B the reference circuit coupling switch 620-3 is switched open, while the remaining reference circuit coupling switches 620-1, 620-2, and 620-4 are closed. The result is a controlled average reference voltage, received by all of the NVR memory banks 612, to which only the selected Vref circuits 618-1, 618-2 and 618-4 contribute.

As will be appreciated, exemplary embodiments as depicted at FIGS. 6A and 6B provide, among other features, incremental control of the reference voltage utilized by each of the NVR memory banks 612, to obtain a value closest to optimal as possible within the universe (four in the depicted example) of Vref circuits 618. Exemplary embodiments as depicted at FIGS. 6A and 6B also provide for switching out of a defective Vref circuit 618-$k$, without loss of its normally associated I/Os 614-$k$ and 616-$k$. These and other disclosed features may, in turn, provide a still higher yield in fabricating multiple bank NVR memory systems.

It will be understood that the exemplary embodiments described in reference to FIG. 4, FIGS. 5A and 5B and FIGS. 6A and 6B may be combined to form other embodiments. For example, FIGS. 7A and 7B show respective states 700A and 700B of one such exemplary embodiment, having one or more of the embodiments depicted at FIGS. 5A and 5B as well as one or more of the embodiments depicted at FIGS. 6A and 6B.

The term "NVR memory system 700" hereinafter means "the NVR memory system structure shown collectively by FIGS. 7A and 7B, capable of moving between states as described, including example states 700A and 700B."

Referring to FIGS. 7A and 7B together, the NVR memory system 700 may have, for example, four (4) NVR memory banks, labeled 712-1, 712-2, 712-3, and 712-4 (referenced collectively as "712," and referenced singly in a generic sense as "712-$k$"). Each NVR memory bank 712-$k$ may comprise an I/O 714-$k$ and an I/O 716-$k$, each of which may have M columns by N rows of NVR bits cells (not individually shown in FIGS. 7A and 7B). The NVR bit cells forming the NVR memory banks 712 may be according to the NVR bit cell 102 shown in FIG. 1. Each NVR memory bank 712-$k$ may have an associated Vref circuit 718-$k$ (referenced collectively as "618," and referenced singly in a generic sense as "718-$k$"). The Vref circuits 718 may be formed of an array, for example a 1×M array, of Vref generating cells according to the FIG. 1 example NVR reference cell 104. It will be understood that each Vref circuit 718-$k$ may, if uncoupled from all other the generating circuits 718 generate a stand-alone reference voltage and these voltages will be referred to, for description of example operations, as VRef-1, VRef-2, VRef-3 and VRef-4 (not shown on FIGS. 7A and 7B). It will be understood that the depicted four NVR memory banks 712 is only one example, and is not intended as any limitation on the scope of any embodiment.

With continuing reference to FIGS. 7A and 7B, the NVR memory system 700 may, according to one aspect, have four reference circuit coupling switches, labeled respectively as 720-1, 720-2, 720-3 and 720-4 (referenced collectively as "720," and referenced singly in a generic sense as "720-$k$"). Each reference circuit coupling switch 720-$k$ selectively couples a corresponding Vref circuit 718-$k$ of an NVR memory bank 712-$k$ to a bank reference distribution line 722-$k$. In one aspect, each bank reference distribution line 722-$k$ couples to the I/O 712-$k$ and 714-$k$ of its corresponding NVR memory bank 712-$k$.

Referring still to FIGS. 7A and 7B, in one aspect the NVR memory system 700 may have three reference line coupling switches, labeled respectively as 724-1, 724-2 and 724-3 (referenced collectively as "724," and referenced singly in a generic sense as "724-$m$"). It will be understood that the quantity three of the reference line coupling switches 724 is only an example, corresponding to the example quantity of four NVR memory banks 712.

According to one aspect, the first reference line coupling switch 724-1 may selectively couple the bank reference distribution line 722-1 of the first NVR memory bank 712-1 to the bank reference distribution line 722-2 of the second NVR memory bank 712-2. The second reference line coupling switch 724-2 may selectively couple the bank reference distribution line 722-2 of the second NVR memory bank 712-2 to the bank reference distribution line 722-3 of the third NVR memory bank 712-3. Likewise the third reference line coupling switch 724-3 may selectively couple the bank reference distribution line 722-3 of the third NVR memory bank 712-3 to the bank reference distribution line 722-4 of the fourth NVR memory bank 712-4.

Referring to FIG. 7A, in the example state 700A all of the reference circuit coupling switches 718 and all of the reference line coupling switches 722 are closed. This produces a CM_VRef of ¼×(VRef-1+VRef-2+VRef-3+VRef-4).

Referring now to FIG. 7B, in the depicted example state 700B the reference circuit coupling switch 720-4 is switched open, while the remaining reference circuit coupling switches 720-1, 720-2, and 720-3 are closed. Further, the first reference line coupling switch 724-1 is switched open, while the remaining reference line coupling switches 724-2 and 724-3 are closed. As readily seen, generation and distribution of the reference voltage in this FIG. 7B example state 700B includes the NVR memory bank 712-1 using the VRef-1 from its Vref circuit 718-1 in a stand-alone manner. The NVR memory banks 712-2, 712-3 and 712-4, on the other hand, use an averaged reference value to which only the Vref circuits 718-2 and 718-3 are selected to contribute. The Vref circuit 718-4 of the NVR memory bank 712-4 is selectively isolated.

Figure 8:
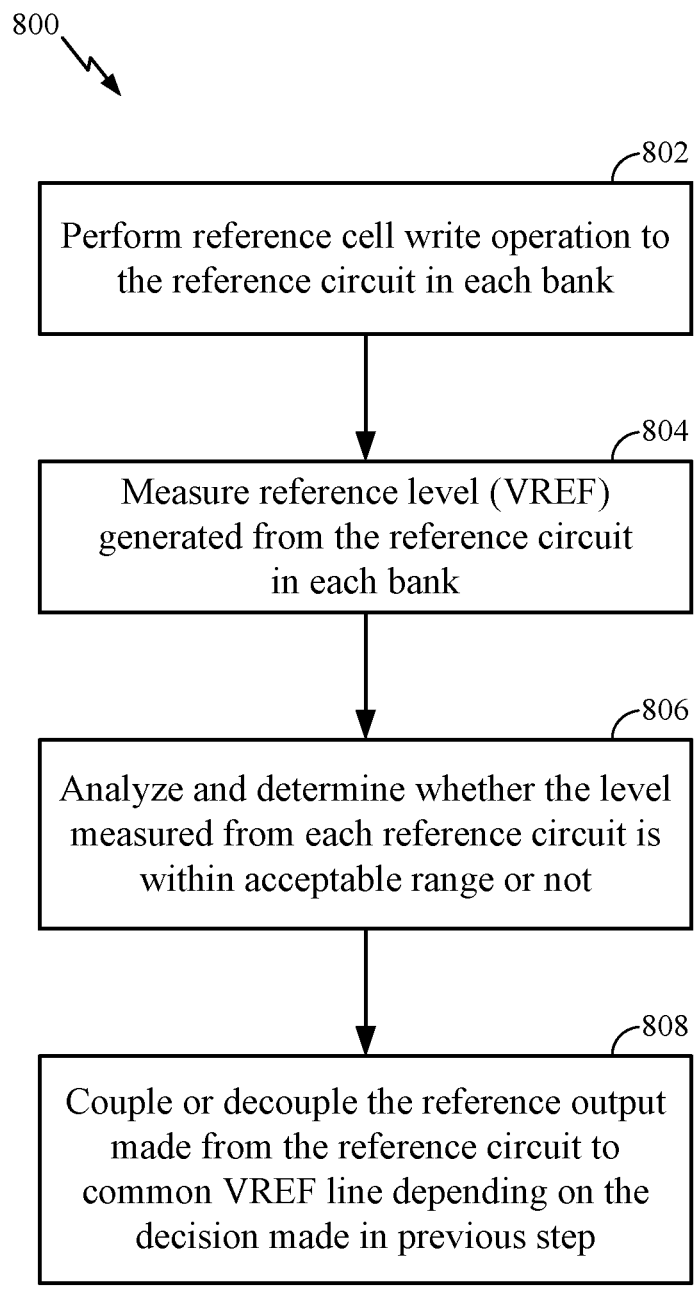
FIG. 8 is a functional flow diagram of one process for configuring a multiple bank resistance memory having controllable, selective switch-coupled/switch-isolatable reference in accordance with one or more exemplary embodiments.

As will be appreciated, selective control of the reference circuit coupling switches 722-$k$ and the reference line coupling switches 720-$k$ provides a combination of selective, incremental averaging and isolation of the individual Vref circuits 718-$k$. These and other features may allow a satisfactory performance from an NVR memory system notwithstanding one or more of the Vref circuits 718-$k$ being out-of-tolerance or otherwise defective. Exemplary embodiments as depicted at FIGS. 7A and 7B therefore may provide, among other benefits, further significantly increased fabrication yield of NVR memory devices FIG. 8 is a functional flow diagram of one example process 800 or configuring a multiple bank resistance memory having controllable, selective coupled/isolatable reference accordance to various exemplary embodiments. Referring to FIG. 8, the process 800 may begin at 802 by performing a reference write operation to the reference circuit in each NVR memory bank. For example, a reference write operation 802 performed on the reference circuit depicted at FIG. 1 may write a logical "0" to one of the first reference resistance memory element 136 and the second reference resistance memory element 138 and a write logical "1" to the other of 136 and 138. Next, the example process 800 may at 804 measure the reference level (VREF) generated from the reference circuit in each bank. For example, a reference measuring operation 804 performed in relation to fabricating or programming a plurality of memory banks as depicted at FIG. 7A, each having a reference circuit as depicted at FIG. 1, may measure the voltage at FIG. 1 node 156.

With continuing reference to FIG. 8, after measuring the reference voltages at 804 the process 800 may, as depicted by process block 806, analyze the measurements obtained at 804 and determine, for each measured reference level, if that reference level is within an acceptable range. As will be appreciated by persons of ordinary skill in the art from this disclosure, the specific voltages constituting an "acceptable range" are readily determined from factors such as the acceptable read error rate, available voltage levels, noise environment, and accuracy of the voltage sense amplifier (e.g., voltage sense amplifier 130 of FIG. 1). Next, the process 800 may, using the measurements obtained at 804 and analysis results from 806, go to 808 and, for example, couple or decouple selected ones of the reference outputs from a common reference line (i.e., form a connection state such as shown at FIG. 6B). It will be understood that this example of coupling and decoupling as represented at block 808 is not limited to switchable connections as shown at FIGS. 6A and 6B, and may be performed on embodiments using other connection means, such as fusible links. In one aspect, the selective coupling at 808 may couple or decouple selected reference line connections, such as depicted at FIG. 5B, to isolate reference lines from one another, and/or form selected common reference lines. In another aspect, the selective coupling at 808 may perform selected coupling and decoupling of a combination of reference circuit isolation switches (or other programmable connection means) such as depicted at FIG. 7B.

Figure 9:
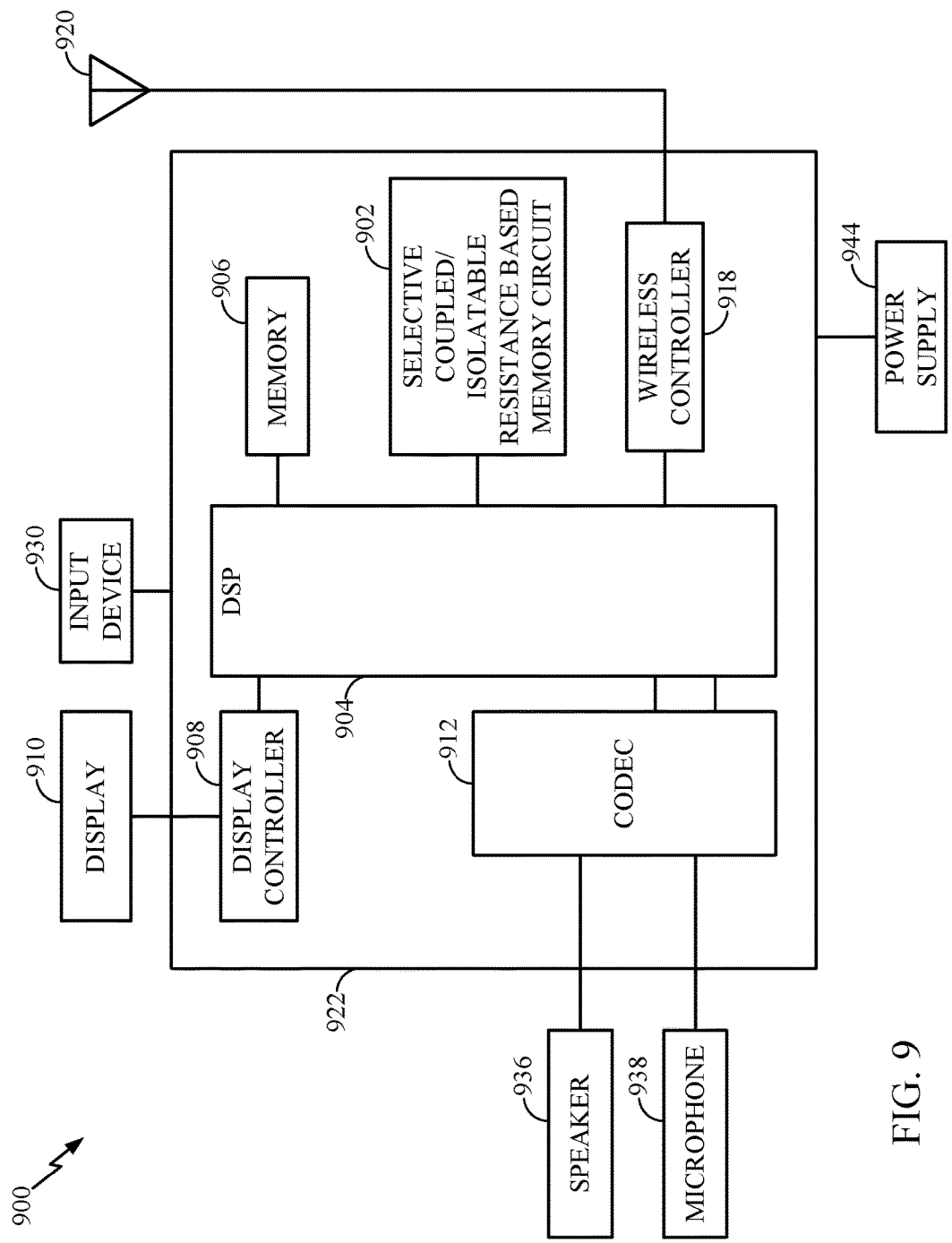
FIG. 9 is a functional block diagram of one example personal computing device according to one or more exemplary embodiments.

FIG. 9 is a functional block diagram of an electronic device 900, such as a wireless phone according to one or more exemplary embodiments. The device 900 may include a selective coupled/isolatable resistance based memory circuit 902 coupled to a processor such as a digital signal processor (DSP) 904 that may be coupled to another memory 906, for example a DRAM. In one illustrative example, the selective coupled/isolatable resistance based memory circuit 902 may include the apparatus such the selective coupled/isolatable NVR memory system 400 described in reference to FIG. 4, or as one alternative, the selective coupled/isolatable reference resistance based memory circuit 902 may include the apparatus such as the selective coupled/isolatable reference NVR memory system 500 described in reference to FIGS. 5A and 5B, or the apparatus such as the switch-coupled selective coupled/isolatable reference NVR memory system 600 described in reference to FIGS. 6A and 6B, or the apparatus such as the switch-coupled selective coupled/isolatable reference coupled/isolatable NVR memory system 700 described in reference to FIGS. 7A and 7B or, in alternative, any combination thereof.

Referring still to FIG. 9, the electronic device 900 may have a display controller 908 coupled to the DSP 904 and to a display 910. In addition, a coder/decoder (CODEC) 912 may be coupled to the DSP 904, and to a speaker 936 and a microphone 938. A wireless controller 918 may be coupled to the digital signal processor 904 and to a wireless antenna 920. In a particular embodiment, the DSP 904, the display controller 908, the selective coupled/isolatable resistance based memory circuit 902, and the CODEC 912, and the wireless controller 918 are included in a system-in-package or system-on-chip (SOC) 922. In a particular embodiment, an input device 930 (e.g., touchpad, keypad, other human command interface) and a power supply 944 are coupled to the SOC 922. Moreover, as illustrated in FIG. 9, in one aspect the display 910, the input device 930, the speaker 936, the microphone 938, the wireless antenna 920, and the power supply 944 may be external to the SOC 922. However, each may be coupled to one or more components of the SOC 922, for example through an interface or a controller.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above.

Figure 10:
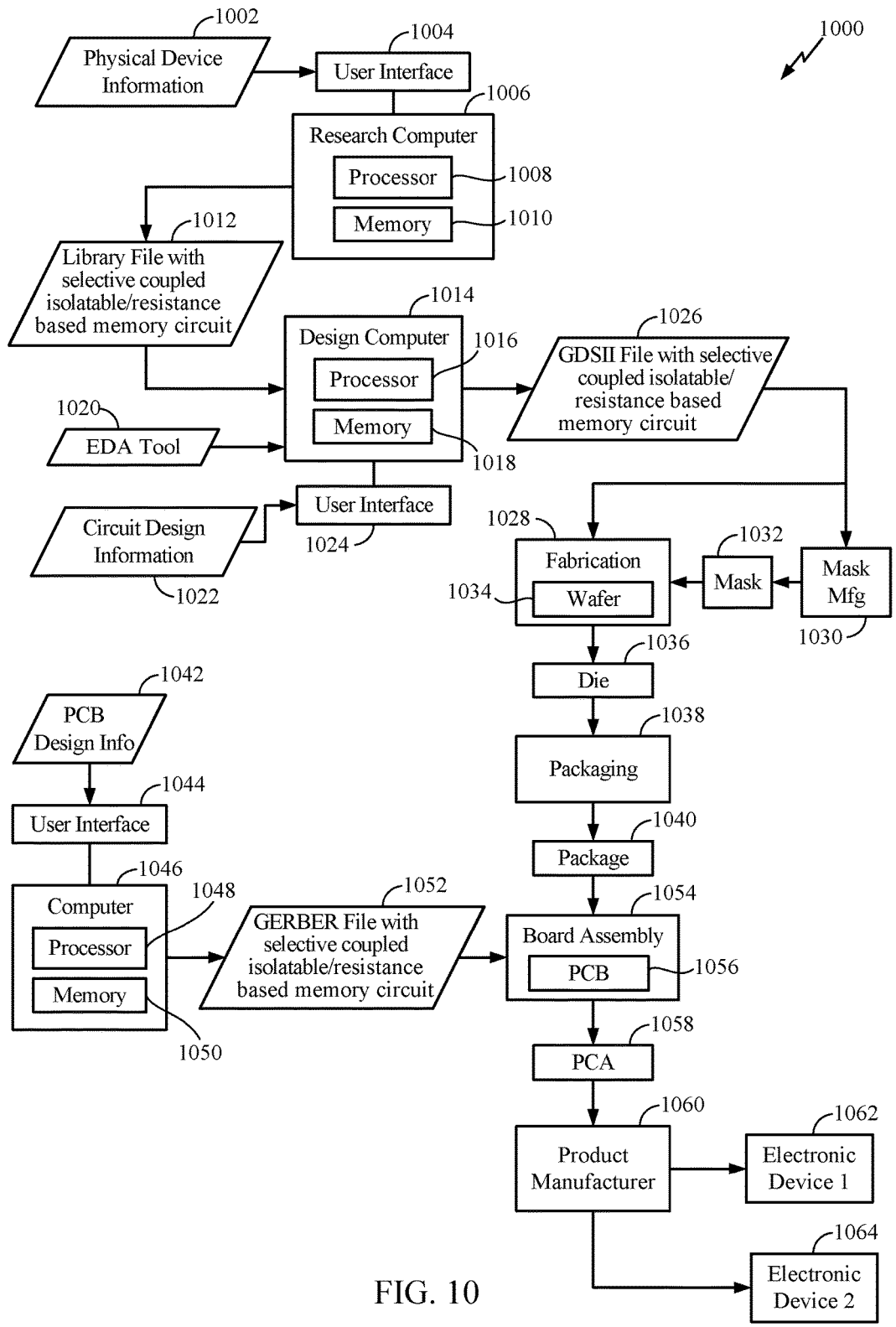
FIG. 10 is a functional flow diagram of one process in fabricating a multiple bank resistance memory having controllable, selective switch-coupled/switch-isolatable reference in accordance with one or more exemplary embodiments.

FIG. 10 depicts a particular illustrative embodiment of an electronic device manufacturing process 1000. Physical device information 1002 may be received in the manufacturing process 1000, such as at a research computer 1006. The physical device information 1002 may include design information representing at least one physical property of a selective coupled/isolatable resistance based memory such as the apparatus of the NVR memory system 400 described in reference to FIG. 4, or as one alternative, the apparatus such as the selective switch coupled/isolatable reference NVR memory system 500 described in reference to FIGS. 5A and 5B, or the apparatus such as the switch-coupled selective coupled/isolatable NVR memory system 600 described in reference to FIGS. 6A and 6B, or the apparatus such as the switch-coupled selective coupled/isolatable NVR memory system 700 described in reference to FIGS. 7A and 7B or, in one alternative, any combination thereof. For example, the physical device information 1002 may include physical parameters, material characteristics, and structure information that may be entered via a user interface 1004 coupled to the research computer 1006. The research computer 1006 may include a processor 1008, such as one or more processing cores, coupled to a computer readable medium such as a memory 1010. The memory 1010 may store computer readable instructions that are executable to cause the processor 1008 to transform the physical device information 1002 to comply with a file format and to generate a library file 1012.

In a particular embodiment, the library file 1012 may include at least one data file including the transformed design information. For example, the library file 1012 may include a library of semiconductor devices including any device(s) of the selective coupled/isolatable NVR memory system 400 described in reference to FIG. 4, or as one alternative, the switch-coupled selective coupled/isolatable reference NVR memory system 500 described in reference to FIGS. 5A and 5B, or the switch-coupled selective coupled/isolatable reference NVR memory system 600 described in reference to FIGS. 6A and 6B, or the switch-coupled selective coupled/isolatable reference NVR memory system 700 described in reference to FIGS. 7A and 7B or, in one alternative, any combination thereof that is provided for use with an electronic design automation (EDA) tool 1020.

The library file 1012 may be used in conjunction with the EDA tool 1020 at a design computer 1014 including a processor 1016, such as one or more processing cores, coupled to a memory 1018. The EDA tool 1020 may be stored as processor executable instructions at the memory 1018 to enable a user of the design computer 1014 to design a circuit including the selective coupled/isolatable reference NVR memory system 400 described in reference to FIG. 4, or as one alternative, the switch-coupled selective coupled/isolatable reference NVR memory system 500 described in reference to FIGS. 5A and 5B, or the switch-coupled selective coupled/isolatable reference NVR memory system 600 described in reference to FIGS. 6A and 6B, or the switch-coupled selective coupled/isolatable reference NVR memory system 700 described in reference to FIGS. 7A and 7B or, in one alternative, any combination thereof, from the library file 1012. For example, a user of the design computer 1014 may enter circuit design information 1022 via a user interface 1024 coupled to the design computer 1014. The circuit design information 1022 may include design information representing at least one physical property of a selective coupled/isolatable reference NVR memory system 400 described in reference to FIG. 4, or as one alternative, the switch-coupled selective coupled/isolatable reference NVR memory system 500 described in reference to FIGS. 5A and 5B, or the switch-coupled selective coupled/isolatable reference NVR memory system 600 described in reference to FIGS. 6A and 6B, or the switch-coupled selective coupled/isolatable reference NVR memory system 700 described in reference to FIGS. 7A and 7B or, in one alternative, any combination thereof. To illustrate, the circuit design property may include identification of particular circuits and relationships to other elements in a circuit design, positioning information, feature size information, interconnection information, or other information representing a physical property of a semiconductor device.

The design computer 1014 may be configured to transform the design information, including the circuit design information 1022 to comply with a file format. To illustrate, the file formation may include a database binary file format representing planar geometric shapes, text labels, and other information about a circuit layout in a hierarchical format, such as a Graphic Data System (GDSII) file format. The design computer 1014 may be configured to generate a data file including the transformed design information, such as a GDSII file 1026 that includes information describing the selective coupled/isolatable reference NVR memory system 500 described in reference to FIGS. 5A and 5B, or the apparatus such as the switch-coupled selective coupled/isolatable reference NVR memory system 600 described in reference to FIGS. 6A and 6B, or the apparatus such as the switch-coupled selective coupled/isolatable reference coupled/isolatable NVR memory system 700 described in reference to FIGS. 7A and 7B or, in alternative, any combination thereof.

The GDSII file 1026 may be received at a fabrication process 1028 to manufacture the selective coupled/isolatable reference NVR memory system 400 described in reference to FIG. 4, or as one alternative, the switch-coupled selective coupled/isolatable reference NVR memory system 500 described in reference to FIGS. 5A and 5B, or the switch-coupled selective coupled/isolatable reference NVR memory system 600 described in reference to FIGS. 6A and 6B, or the switch-coupled selective coupled/isolatable reference NVR memory system 700 described in reference to FIGS. 7A and 7B or, in one alternative, any combination thereof, according to transformed information in the GDSII file 1026. For example, a device manufacture process may include providing the GDSII file 1026 to a mask manufacturer 1030 to create one or more masks, such as masks to be used for photolithography processing, illustrated as a representative mask 1032. The mask 1032 may be used during the fabrication process to generate one or more wafers 1034, which may be tested and separated into dies, such as a representative die 1036. The die 1036 may include a circuit having one or more devices of the selective coupled/isolatable reference NVR memory system 400 described in reference to FIG. 4, or the switch-coupled selective coupled/isolatable reference NVR memory system 500 described in reference to FIGS. 5A and 5B, or the switch-coupled selective coupled/isolatable reference NVR memory system 600 described in reference to FIGS. 6A and 6B, or the switch-coupled selective coupled/isolatable reference NVR memory system 700 described in reference to FIGS. 7A and 7B or, in one alternative, any combination thereof.

The die 1036 may be provided to a packaging process 1038 where the die 1036 is incorporated into a representative package 1040. For example, the package 1040 may include the single die 1036 or multiple dies, such as a system-in-package (SiP) arrangement. The package 1040 may be configured to conform to one or more standards or specifications, such as Joint Electron Device Engineering Council (JEDEC) standards.

Information regarding the package 1040 may be distributed to various product designers, such as via a component library stored at a computer 1046. The computer 1046 may include a processor 1048, such as one or more processing cores coupled to a memory 1050. A printed circuit board (PCB) tool may be stored as processor executable instructions at the memory 1050 to process PCB design information 1042 received from a user of the computer 1046 via a user interface 1044. The PCB design information 1042 may include physical positioning information of a packaged semiconductor device on a circuit board, the packaged semiconductor device corresponding to the package 1040, the selective coupled/isolatable reference NVR memory system 400 described in reference to FIG. 4, or the switch-coupled selective coupled/isolatable reference NVR memory system 500 described in reference to FIGS. 5A and 5B, or the switch-coupled selective coupled/isolatable reference NVR memory system 600 described in reference to FIGS. 6A and 6B, or the switch-coupled selective coupled/isolatable reference NVR memory system 700 described in reference to FIGS. 7A and 7B or, in one alternative, any combination thereof.

The computer 1046 may be configured to transform the PCB design information 1042 to generate a data file, such as a GERBER file 1052 with data that includes physical positioning information of a packaged semiconductor device on a circuit board, as well as layout of electrical connections such as traces and vias, where the packaged semiconductor device corresponds to the package 1040 including the device components to be used in the selective coupled/isolatable reference NVR memory system 400 described in reference to FIG. 4, or the switch-coupled selective coupled/isolatable reference NVR memory system 500 described in reference to FIGS. 5A and 5B, or the switch-coupled selective coupled/isolatable reference NVR memory system 600 described in reference to FIGS. 6A and 6B, or the switch-coupled selective coupled/isolatable reference NVR memory system 700 described in reference to FIGS. 7A and 7B or, in one alternative, any combination thereof. In other embodiments, the data file generated by the transformed PCB design information may have a format other than a GERBER format.

The GERBER file 1052 may be received at a board assembly process 1054 and used to create PCBs, such as a representative PCB 1056, manufactured in accordance with the design information stored within the GERBER file 1052. For example, the GERBER file 1052 may be uploaded to one or more machines for performing various steps of a PCB production process. The PCB 1056 may be populated with electronic components including the package 1040 to form a represented printed circuit assembly (PCA) 1058.

The PCA 1058 may be received at a product manufacture process 1060 and integrated into one or more electronic devices, such as a first representative electronic device 1062 and a second representative electronic device 1064. As an illustrative, non-limiting example, the first representative electronic device 1062, the second representative electronic device 1064, or both, may be selected from the group of a set top box, a music player, a video player, an entertainment unit, a navigation device, a communications device, a personal digital assistant (PDA), a fixed location data unit, and a computer. As another illustrative, non-limiting example, one or more of the electronic devices 1062 and 1064 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although one or more of FIGS. 1-9 may illustrate remote units according to the teachings of the disclosure, the disclosure is not limited to these exemplary illustrated units. Embodiments of the disclosure may be suitably employed in any device that includes active integrated circuitry including memory and on-chip circuitry for test and characterization.

One or more aspects of the embodiments disclosed with respect to FIGS. 1-9 may be included at various processing stages, such as within the library file 1012, the GDSII file 1026, and the GERBER file 1052, as well as stored at the memory 1010 of the research computer 1006, the memory 1018 of the design computer 1014, the memory 1050 of the computer 1046, the memory of one or more other computers or processors (not shown) used at the various stages, such as at the board assembly process 1054, and also incorporated into one or more other physical embodiments such as the mask 1032, the die 1036, the package 1040, the PCA 1058, other products such as prototype circuits or devices (not shown), or any combination thereof. Although various representative stages of production from a physical device design to a final product are depicted, in other embodiments fewer stages may be used or additional stages may be included. Similarly, the process 1000 may be performed by a single entity, or by one or more entities performing various stages of the process 1000.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A Non-Volatile Resistive bitcell array memory comprising:
  means for generating a first reference voltage;
  means for generating a second reference voltage;
  means for providing a first sensing reference and a second sensing reference, including means for selectively combining the first reference voltage and the second reference voltage into a common voltage and for selectively providing the common voltage as the first sensing reference, and means for selectively providing the first reference voltage as the first sensing reference;
  means for sensing a voltage of a first array of bitcells relative to the first sensing reference; and
  means for sensing a voltage of a second array of bitcells relative to the second sensing reference.

2. The memory of claim 1, wherein the means for providing the first sensing reference and the second sensing reference further includes means for selectively providing the second reference voltage as the second sensing reference.

3. The memory of claim 1, wherein the means for providing the first sensing reference and the second sensing reference further includes means for selectively providing the first reference voltage as the second sensing reference.

* * * * *